US005301404A

United States Patent [19]

Ochiai et al.

[11] Patent Number: 5,301,404

[45] Date of Patent: Apr. 12, 1994

[54] METHOD OF PRODUCING PRINTER HEAD USING PIEZOELECTRIC MEMBER

[75] Inventors: Kuniaki Ochiai; Shigeo Komakine; Toshihiro Tsukamoto, all of Shizuoka, Japan

[73] Assignees: Tokyo Electric Co., Ltd.; Toshiba-Emi Limited, both of Tokyo, Japan

[21] Appl. No.: 37,586

[22] Filed: Mar. 26, 1993

[30] Foreign Application Priority Data

Mar. 26, 1992 [JP] Japan .................................. 4-067990

[51] Int. Cl.[5] .............................................. H01L 41/22

[52] U.S. Cl. .................................. 29/25.35; 29/890.1; 205/127; 205/211; 346/140 R

[58] Field of Search ............................ 29/25.35, 890.1; 346/140 R, 140 A; 205/69, 127, 210, 211

[56] References Cited

U.S. PATENT DOCUMENTS

| | | | |
|---|---|---|---|
| 5,193,256 | 3/1993 | Ochiai et al. | 29/25.35 |
| 5,194,877 | 3/1993 | Lam et al. | 29/890.1 X |

FOREIGN PATENT DOCUMENTS

| | | |
|---|---|---|
| 55-11811 | 1/1980 | Japan . |
| 61-59913 | 12/1986 | Japan . |
| 63-252750 | 10/1988 | Japan . |
| 2-150355 | 6/1990 | Japan . |

*Primary Examiner*—Carl E. Hall

*Attorney, Agent, or Firm*—Oblon, Spivak, McClelland, Maier & Neustadt

[57] ABSTRACT

A method of producing a printer head wherein a substrate including at least one piezoelectric member polarized in its thickness direction is formed. A plurality of grooves and a plurality of posts are alternately defined in the substrate. A pre-processing solution is allowed to flow along the grooves at the following relative velocity so as to effect pre-processing when the velocity of the pre-processing solution for electroless plating relative to an object to be plated is V, the height of each of electrodes formed on the internal surfaces of the grooves is H, the width of each groove is W and a contact angle at which the pre-processing solution is brought into contact with the internal surfaces of the grooves is $\theta$.

$$VW^2\cdot(1+\cos\theta)/H^2>0.6\ \text{mm/s}$$

Thereafter, the substrate is immersed in an electroless plating solution to form the electrodes. A roof is joined to the surface of the substrate so as to close the top opening surfaces of the grooves, thereby defining a plurality of pressure chambers.

13 Claims, 7 Drawing Sheets

METHOD OF PRODUCING PRINTER HEAD USING PIEZOELECTRIC MEMBER

BACKGROUND OF THE INVENTION

1. Field of the Invention

The present invention relates to a method of producing a printer head of an on-demand type, which is suitable for use in a so-called ink-jet type printer for printing liquid ink onto a sheet of paper.

2. Description of the Related Art

As printer heads of so-called on-demand types for jetting ink drops in accordance with painting instructions, there are known one of a type for bubbling ink with heat and jetting it as has been disclosed in Japanese Patent Publication No. 61-59913, for example, and one of a type for applying an electric field to a piezoelectric element and jetting ink owing to the deformation of the piezoelectric element as has been described in Japanese Patent Application Laid-Open Publication No. 55-11811.

According to the former (the invention disclosed in Japanese Patent Publication No. 61-59913 or the like), respective jetting units are reduced in size. Therefore, a number of nozzles can be arranged at high density. However, this disclosure is accompanied by drawbacks that bubbling an optical density of the ink cannot be increased because of the bubbling and the ink is burned in a heating plate for heating the ink, thereby impairing durability of the jetting units. According to the latter (the invention disclosed in Japanese Laid-Open Patent (Kokai) No. 55-11811 or the like), problems concerning to the optical density of the ink and the durability of the jetting units do not arise. Since, however, the width of a piezoelectric element increases, a number of nozzles cannot be arranged at high density.

FIG. 8 shows the printer head using the piezoelectric element, which has been disclosed in Japanese Laid-Open Patent (Kokai) No. 55-11811, for example. As shown in FIG. 8(*a*), a liquid reservoir 21, a plurality of pressure chambers 22 connected to the liquid reservoir 21 and having a diameter of about 2 mm, and a plurality of channels 23 coupled to the pressure chambers 22 are formed in a substrate 20 by etching. The channels 23 are gradually narrowed toward the tips of nozzles 24. As shown in FIG. 8(*b*), other substrate 25 has a plurality of piezoelectric elements 26 arranged in corresponding relationship to the pressure chambers 22. A desired printer head is formed by stacking the substrates 20 and 25 on each other and joining them. In this printer head, the voltage is applied to a desired piezoelectric element 26. Ink drops are jetted from the nozzle 24 owing to a variation in the capacity of each pressure chamber 22 based on the deformation of the piezoelectric element 26.

However, the printer head shown in FIG. 8 causes pressure losses when the pressure developed in each pressure chamber 22 is transmitted to each channel 23. The pressure losses differ in magnitude or level according to the size of each channel 23 and thus jetting characteristics of ink from a plurality of nozzles 24 also differ from one another. This tendency often appears with an increase in the number of the nozzles 24 and hence the number of the nozzles 24 cannot be increased.

There are also known printer heads wherein piezoelectric elements are used and a number of nozzles are provided as has been disclosed in Japanese Laid-Open Patent (Kokai) No. 63-252750 and Japanese Laid-Open Patent (Kokai) No. 2-150355. A description will now be made of the invention disclosed in Japanese Laid-open Patent (Kokai) No. 2-150355 with reference to FIG. 9. The bottom sheet 30 is polarized in the direction indicated by the arrow, and includes a number of parallel grooves 31 defined by side walls 32 and a bottom surface 33. Further, the top opening surfaces of the respective grooves 31 are closed by joining a top sheet 35 to the top 34 of each side wall 32. Metal electrodes 37 are formed under evaporation on the internal surfaces, corresponding to both internal surfaces of the respective grooves 31, of the side walls 32 so as to fall within a range of about one-half the entire height of each groove as seen on the top sheet 35 side.

That is, the bottom sheet 30 is held by a jig in a vacuum deposition device. Then, a parallel beam of deposition metallic atoms is induced toward the bottom sheet 30 with an angle of $\delta$ formed with respect to each side wall 32 as shown in FIG. 10. Thus, a metallic film is deposited on a portion of one surface of each side wall 32. Then, the parallel beam of deposition metallic atoms is introduced into the bottom sheet 30 in the same manner as described above in a state in which the bottom sheet 30 has been turned 180° with respect to the horizontal direction in FIG. 10. Thus, the metallic electrodes 37 are deposited on a range equal to about one-half the upper portion of both side surface of each side wall 32. At this time, the metallic film deposited on the top 34 of each side wall 32 is removed in the successive step.

Further, each of the pressure chambers is defined by closing each groove 31 with the top sheet 35. Thereafter, supply ports, which are in communication with an ink supply unit, are defined in one ends of the pressure chambers and jetting ports for jetting ink are defined in the other ends of the pressure chambers, thereby completing a printer head.

In this type of printer head, when voltages opposite in polarity to each other are applied to the electrodes 37 of the adjacent two side walls 32, the side walls 32 are subjected to the potential in the direction orthogonal to the polarity indicated by the arrow, of the bottom sheet 30, thereby producing shearing strain as indicated by the dot lines in FIG. 9. As a consequence, the capacity of the pressure chamber (groove 31) between the side walls 32 which has produced the shearing strain is abruptly reduced to increase pressure in the pressure chamber, thereby jetting ink from the jetting ports.

In the printer head disclosed in Japanese Laid-Open Patent (Kokai) No. 2-150355, as shown in FIGS. 9 and 10, about eight nozzles (jetting ports) can be arranged at high density within a range of width of 1 mm. Further, a pressure loss is not produced between each pressure chamber and each nozzle. Thus, an increase in the number of the nozzles can be effected. However, the printer head has the following problems.

A first problem is that the manufacturing cost becomes high because a method of forming electrodes is cumbersome and the electrodes 37 are formed by using an expensive vacuum deposition device.

A second problem is that an uniform electric field cannot be applied across the bottom sheet 30 formed of a piezoelectric material. That is, since the piezoelectric material is normally of a calcined member formed of crystalline particles, grinding surfaces produced by forming each groove 31 are of grinding surfaces having irregularities developed as the crystalline particles are.

On the other hand, the metallic deposition using the vacuum deposition device for forming the electrodes 37 is not effected for portions not opposite to a deposition metallic atoms emitting source. Accordingly, the metal is deposited only on each convex portion on the surface of the grinding surfaces of the grooves 31 and is not deposited on the concave portion. Each concave portion serves as a pinhole. Therefore, the uniform electric field cannot be applied to the bottom sheet 30.

A third problem is that it is necessary to form protection films because the grinding surfaces of the grooves 31 are corroded by being in contact with the ink and the protection films is hard to form. Since the bottom sheet 30 is formed of the piezoelectric material, it has concave-convex surfaces. It is therefore so difficult to form protection films comprised of $Si_3N_4$ or SiON so as to avoid the pinholes. Further, since the above-described electrodes 37 also have pinholes, they cannot be functionally anticipated as being the protection films.

SUMMARY OF THE INVENTION

It is an object of the present invention to provide a method of producing a printer head using piezoelectric members, suitable for use in an ink-jet type printer, wherein the efficiency of formation of each electrode can be improved.

It is another object of the present invention to provide a method of producing a printer head using piezoelectric members wherein ink to be used can be effectively separated from the piezoelectric members.

In order to achieve the above objects, there is provided a method of producing a printer head, comprising the steps of:

forming a substrate including at least one piezoelectric member polarized in its thickness direction;

defining at equal intervals a plurality of mutually parallel grooves and a plurality of posts disposed on both sides of the respective grooves from the surface of the substrate;

causing a pre-processing solution to flow along the grooves at the following relative velocity so as to effect pre-processing when the velocity of the pre-processing solution for electroless plating relative to an object to be plated is V, the height of each of electrodes formed on the internal surfaces of the grooves is H, the width of each groove is W and a contact angle at which the pre-processing solution is brought into contact with the internal surfaces of the grooves is $\theta$;

$$VW^2.(1+\cos\theta)/H^2>0.6 \text{ mm/s}$$

thereafter immersing the substrate in an electroless plating solution;

forming the electrodes on the internal surfaces of the grooves defined in the piezoelectric member;

joining a roof to the surface of the substrate so as to close the top opening surfaces of the grooves; and defining a plurality of pressure chambers respectively connected to an ink supply unit and ink delivery portions.

Further, the pre-processing solution may be allowed to flow along the grooves at a relative velocity of $VW^2.(1+\cos\theta)/H^2>0.6$ mm/s so as to effect the pre-processing.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

Figure 1A:
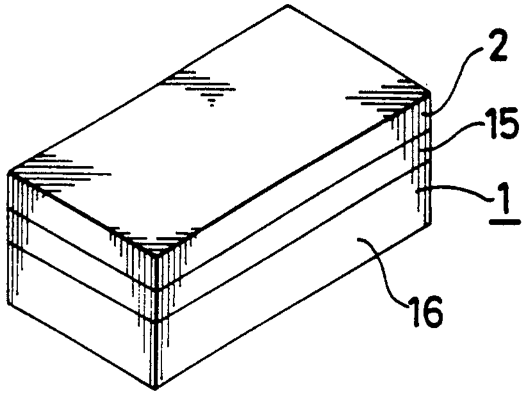
FIGS. 1(*a*), 1(*b*) and 1(*c*) are perspective views showing a first embodiment of the present invention and illustrating a process for producing a printer head.
Figure 1B:
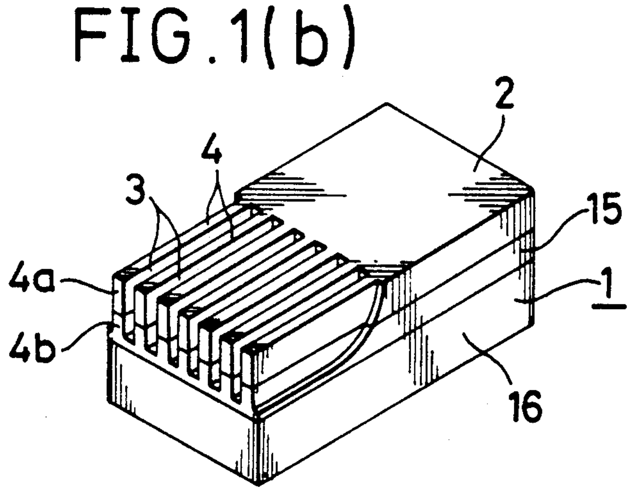
Figure 1C:
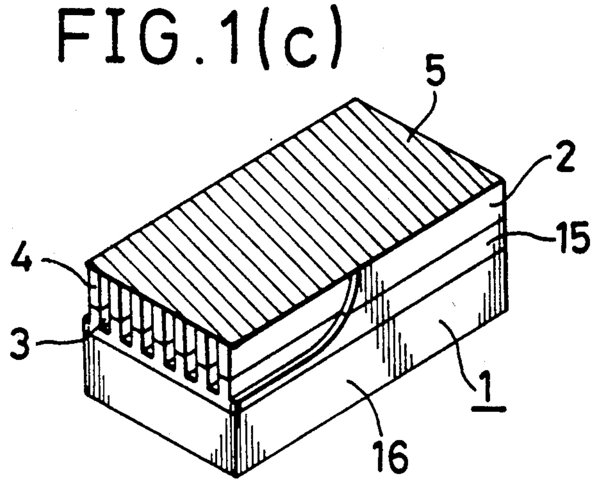

A first embodiment of the present invention will hereinafter be described with reference to FIGS. 1 through 5. A description will first be made of the structure of a printer head in order of its production steps with reference to FIGS. 1 through 3. As shown in FIG. 1(*a*), a resinous adhesive comprised principally of an epoxy resin having high adhesive force is applied on a bottom plate 16 formed of aluminum or glass having high rigidity and less thermal deformation. A piezoelectric member 2 polarized in its thickness direction is placed on the resinous adhesive to be brought into contact therewith. Then, the bottom plate 16, a lower layer 15 comprised of the resinous adhesive, and the piezoelectric member 2 are joined together in the form of three layers by hardening the resinous adhesive to form a substrate 1. A structural adhesive is normally used as the adhesive used for formation of the lower layer 15. However, the structural adhesive is subjected to a deaeration process to remove bubbles from entering therein. In order to prevent the polarized property of the piezoelectric member 2 from being deteriorated, it is desirable that the hardening temperature of the adhesive is 130° C. or less. In the present embodiment, an adhesive of a product name 2651 manufactured by Grace Japan Co., Ltd. was used.

As shown in FIG. 1(*b*), a plurality of grooves 3, which extend into the lower layer 15 from the surface of the piezoelectric member 2, are ground and processed at predetermined intervals in parallel. In this step, columns or posts 4 located on both sides of each groove 3 are also formed but comprise upper posts 4*a* of the piezoelectric member 2 and lower posts 4*b* of the lower layer 15 having small rigidity as compared with that of the piezoelectric member 2. In the present embodiment, the width of each of the grooves 3, the pitch of each groove 3 to be arranged, the depth of each groove 3 and the thickness of the piezoelectric member 2 were set to 86 μm, 169 μm, 375 μm and 240 μm respectively. Further, a diamond wheel of a dicing saw which is used to cut a wafer upon formation of an IC substrate is used as a tool for cutting the grooves 3. In the present embodiment, the grooves 3 were mechanically ground by rotating a 2-inch type blade of either NBCZ1080 or NBCZ1090 manufactured by Kabushiki Kaisha Disco at 30,000 r.p.m.

Next, washing, catalyzing, and accelerating processing are effected as pre-processing prior to the formation of electrodes by the electroless plating. The object of the washing processing is to activate the surface to be plated and to enhance hydrophilic property of the surface of the substrate 1. A catalyst or a plating solution thus easily flows into the grooves 3 of the substrate 1. In the present embodiment, the washing was effected by using ethanol. The object of the catalyzing processing is to immerse the substrate 1 in the catalyst used as the pre-processing solution composed of palladium chloride, tin chloride, hydrochloric acid, etc. and to deposit complex compound of Pd.Sn on the entire surface of each groove 3. When the catalyzing processing is effected, the complex compound of the Pd.Sn is deposited on the surfaces of each upper post 4*a* and each lower post 4*b* exposed to each groove 3. In the present embodiment, an OPC catalyst 80 (whose surface tension is 67 dyne/cm) produced by Okuno Seiyaku was used as the catalyst. The catalyzing processing was effected under the condition that the velocity of the catalyst relative to an object (substrate 1) to be plated is 0.5 m/s. Then, the accelerating processing is conducted to make catalytic the complex compound deposited on the substrate 1 by the catalyzing processing. The complex compound which has been deposited on each post 4 becomes a metallized Pd acting as a catalytic nucleus. In the present embodiment, an accelerator 500 (whose surface tension is 70 dyne/cm) produced by Okuno Seiyaku was used as the pre-processing solution, i.e., the accelerator. The accelerating processing was made under the condition that the velocity of the accelerator to the object (substrate 1) to be plated is 0.5 m/s. Incidentally, the pre-processing was conducted using a slant-type processing tank in the present embodiment. However, a processing tank of either horizontal or vertical type, for example, may be used.

Figure 2A:
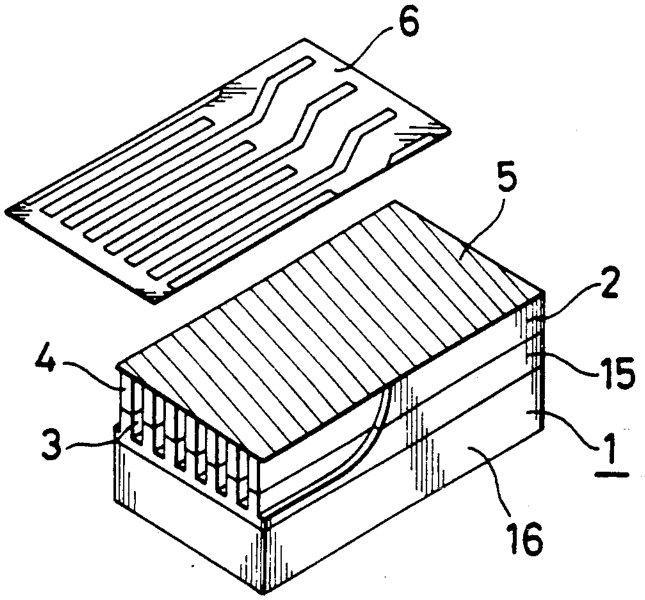
FIGS. 2(*a*) and 2(*b*) are perspective views showing another process for fabricating a printer head.
Figure 2B:
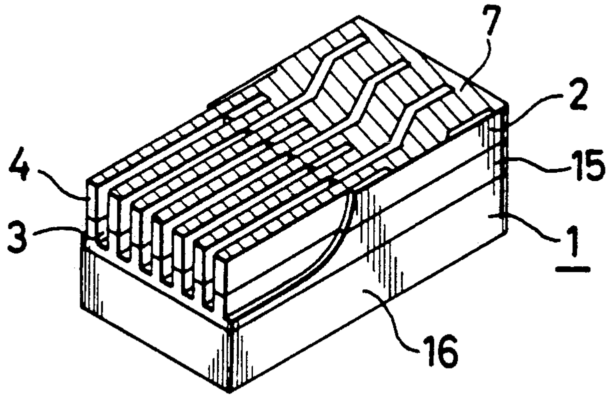

Next, a mask is applied on the surface of the piezoelectric member 2 exclusive of regions corresponding to wiring patterns to be formed. According to this method, a dry film 5 is applied on the surface of the piezoelectric member 2 as shown in FIG. 1(*c*). Further, a resist mask 6 on which wiring patterns are formed is placed on the dry film 5 as shown in FIG. 2(*a*) to effect exposure and development processes. Thus, a resist film 7 is formed on the surface of the piezoelectric member 2, i.e., portions other than the wiring pattern forming regions and the entire surfaces of the grooves 3 by the dry film 5 as shown in FIG. 2(*b*). Thus, the metallized Pd remains in the wiring pattern forming regions of the piezoelectric member 2 and the entire surfaces of the grooves 3.

Then, the product (substrate 1) is immersed in the plating solution to effect the electroless plating. The plating solution comprises a metallic salt and a reductant as principal components, a pH moderator, a buffer, a complexing agent, an accelerator, a stabilizer and a modifier. When the substrate 1 is immersed in the plating solution, plating is deposited on the metallized Pd acting as a catalytic nucleus, so that electrodes 8 are formed on their corresponding surfaces of the posts 4 exposed to the grooves 3 and wiring patterns 9 are formed on the surface of the piezoelectric member 2. In the present embodiment, a low-temperature plating solution (whose surface tension is 64 dyne/cm) of nickel-phosphorus was used as the plating solution and the plating was applied on concave-convex surfaces of the piezoelectric member 2, which are formed of particles having a size range of 2 μm to 4 μm. As a result, a uniform nickel plating film free of pin holes and having a thickness of 1 μm to 2 μm, was formed. It is unnecessary to strictly control the relative velocity between the plating solution and the substrate 1 during the plating processing step. Further, the plating solution may be stirred so as to develop a suitable relative velocity. This reason is as follows. Since each surface to be plated, which has been subjected to the pre-processing step, is made hydrophilic, it is considered that a satisfactory plating is deposited regardless of the magnitude of the relative velocity so long as the relative velocity is obtained.

Figure 3A:
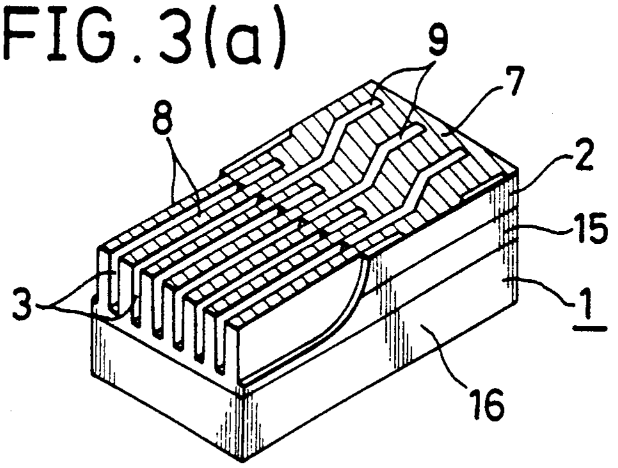
FIGS. 3(*a*), 3(*b*) and 3(*c*) are perspective views illustrating a further process for producing a printer head.
Figure 3B:
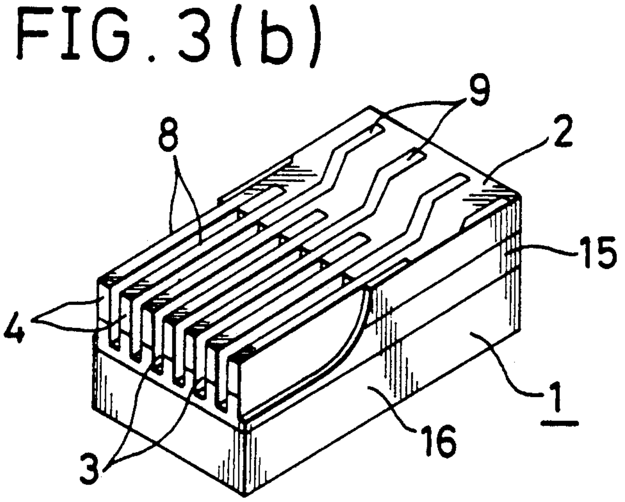
Figure 3C:
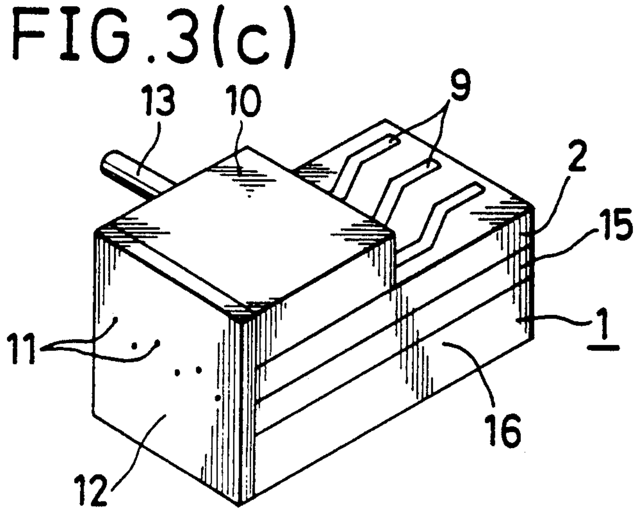

Next, a resist film 7 applied on the surface of the piezoelectric member 2 is removed as shown in FIG. 3(*b*). Then, a roof plate 10 is fixed on the surface of the piezoelectric member 2. A nozzle plate 12 having a plurality of ink jetting holes 11 defined therein is fixedly mounted on the sides of the substrate 1 and the roof plate 10 so that the ink jetting holes 11 coincide with the grooves 3, respectively. An ink supply pipe 13 for supplying ink to the grooves 3 from an ink supply unit (not shown) is attached to the roof plate 10 to complete a printer head. At this time, the grooves 3 are closed or blocked by the roof plate 10 so as to define pressure chambers 14.

Figure 4:
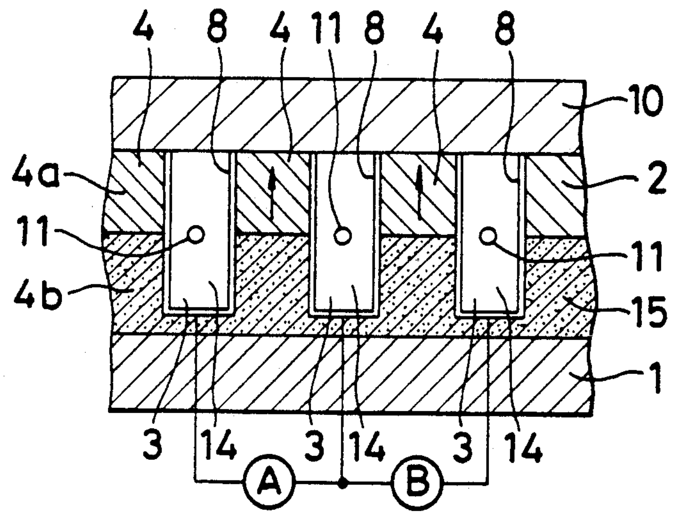
FIG. 4 is a vertical cross-sectional front view showing the condition of completion of the printer head.

A description will now be made of a case in which ink is jetted from the centrally-defined pressure chamber 14 shown in FIG. 4. The ink is supplied to each of the pressure chambers 14 through the ink supply pipe 13 shown in FIG. 3(*c*). Now, a voltage A is applied through the conductive patterns 9 between the electrode 8 of the centrally-defined pressure chamber 14 and another electrode 8 of the pressure chamber 14 disposed on the left side as seen from the central pressure chamber 14, whereas a voltage B is applied between the electrode 8 of the central pressure chamber 14 and the electrode 8 of the pressure chamber 14 disposed on the right side as seen from the central pressure chamber 14. The voltages A and B are antipedal in polarity to each other. An electric field is applied to each of the upper posts 4*a* in the direction orthogonal to the polarization direction indicated by the arrow. As a result, the post 4 disposed on the left side as seen from the central pressure chamber 14, is deformed to the left and the post 4 disposed on the right side is distorted to the right. Further, the capacity of the central pressure chamber 14 increases whereas the capacities of the pressure chambers 14 disposed on both sides are reduced.

Figure 5:
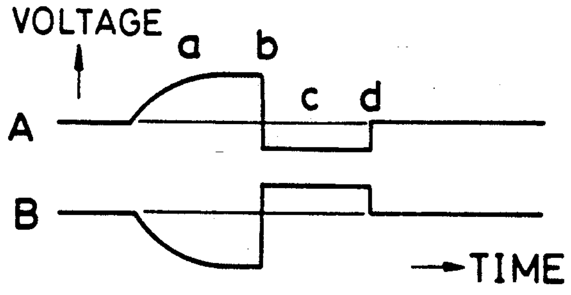
FIG. 5 is a timing chart for describing the voltage applied to each electrode.

FIG. 5 shows the relationship between the applied conditions of the voltages A and B. Since the voltages A and B gradually increase during a fixed time interval a, the ink in the right and left pressure chambers 14 whose capacities are reduced, is not jetted through the ink jetting holes 11. The central pressure chamber 14 increases in capacity so as to reduce its internal pressure, thereby slightly reducing the meniscus of the ink jetting hole 11 and absorbing ink from the ink supply unit communicating with the groove 3. Since the voltage opposite to the present applied voltage is abruptly applied to the electrode 8 at a point b in FIG. 5, the post 4 disposed on the left side of the central pressure chamber 14 is deformed to the right, whereas the right post 4 is deformed to the left. Further, the capacity of the central pressure chamber 14 is abruptly reduced. Thus, the ink is jetted through the ink jetting holes 11 of the central pressure chamber 14. The voltage is maintained during a fixed period as indicated by c in FIG. 5. During the period c, the tail of the ink drop while being in flight is not separated from the ink jetting holes 11. When the application of the voltage to the electrode 8 is abruptly stopped at a point d in FIG. 5, the deformed posts 4 are returned to the original position to abruptly reduce the internal pressure of the central pressure chamber 14. Thus, the ink jetted from the ink jetting holes 11 is absorbed inwardly, so that the tail of the flying ink drop is separated. Immediately after the application of the voltage to each electrode 8 has been stopped, the internal pressure of each of the pressure chambers 14 disposed on both sides of the central pressure chamber 14 increases but does not reach pressure of such an extent that the ink is allowed to fly through the ink jetting holes 11.

As described above, the portions (upper posts 4*a*) of the posts 4 on the roof plate 10 are formed of the piezoelectric member 2 having high rigidity, whereas the remaining portions (lower posts 4*b*) thereof are formed of the lower layer 15 having rigidity lower than that of the piezoelectric member 2. Therefore, a force of each lower post 4*b*, which is resistant to the strain developed in each upper post 4*a* of the piezoelectric member 2, is small. Thus, the amount of strain developed in the post 4 increases, thereby improving an ink-drops jetting characteristic.

A description will be made of the relative velocity between the substrate 1 (object to be plated) and the pre-processing solution (catalyst, accelerator) employed in the pre-processing step during the electroless plating process and the substrate 1 and the relative velocity between the electroless plating solution employed during the electroless plating process.

The velocity (mm/s) of the pre-processing solution relative to the object to be plated is represented by V, the height (μm) of each electrode 8 to be formed on the internal surface of each groove 3 is represented by H, the width (μm) of each groove 3 is represented by W and a contact angle at which the pre-processing solution is brought into contact with the internal surface of each groove 3, is represented by θ. The electroless plating is applied to the object while varying these parameters and the produced plated-metals (electrodes 8) are evaluated. A table 1 shows the result of evaluation obtained by experiments. In the table 1, a deposited state A shows a case in which pinhole-free and uniform electrodes 8 are formed over the entire internal surfaces of the grooves 3. A deposited state B shows a case in which the electrodes 8 are formed on the entire internal surfaces of the grooves 3 but a film thickness of the plating is non-uniform. Further, a deposited state C shows a case in which the electrodes 8 are formed only on the upper portions of the grooves 3.

Incidentally, the contact angle θ was measured by using a contact-angle meter CA-S350 produced by Kyowa Kaimen Kagaku Kabushiki Kaisha.

When the pre-processing solution is made to flow along each groove 3 at the relative velocity at which the following condition is met, judging from the result of the experiments shown in Table 1, $VW^2.(1+\cos\theta)/H^2>0.6$ mm/s (relative velocity) it is understood that the electrodes 8 are formed on the entire internal surfaces of the grooves 3 defined by the piezoelectric member 2 having irregularities and the lower layer 15. When, on the other hand, the pre-processing solution is made to flow along the grooves 3 at the relative velocity at which the following condition is met, $VW^2.(1+\cos\theta)/H^2>0.6$ mm/s (relative velocity) it is understood that the pinholes-free and uniform electrodes 8 are formed on the entire internal surfaces of the grooves 3 defined by the piezoelectric member 2 having the irregularities and the lower layer 15.

Figure 6A:
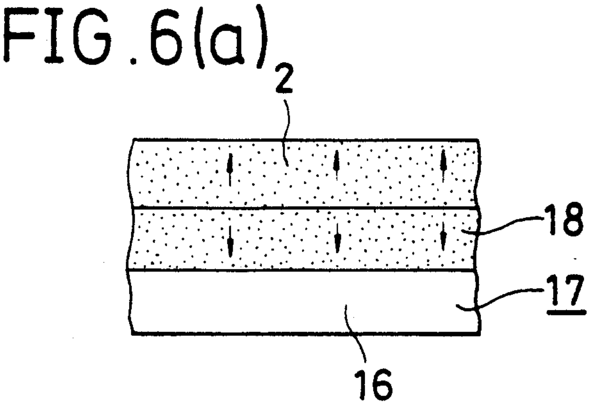
FIG. 6 shows a second embodiment of the present invention, in which FIG. 6(*a*) is a front view of a substrate and FIG. 6(*b*) is a vertical cross-sectional front view of a printer head.
Figure 6B:
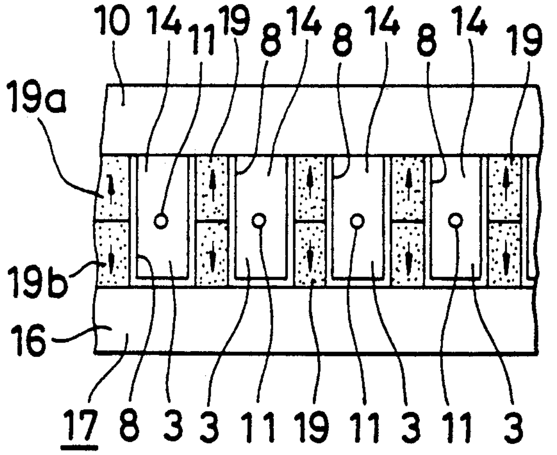

A second embodiment of the present invention will next be described with reference to FIG. 6. The same elements of structure as those employed in the first embodiment are indicated by like reference numerals and therefore descriptions thereof are omitted. The first embodiment shows the case where the substrate 1 is composed of the bottom plate 16, the lower layer 15 and the piezoelectric member 2. In the present embodiment, however, a substrate 17 is formed by joining two piezoelectric members 2, 18 polarized in their different thickness directions to a bottom plate 16.

In a manner similar to the first embodiment, a plurality of grooves 3 are formed in a predetermined depth from the surface of the piezoelectric member 2 and a plurality of posts 19 are formed so as to be located on both sides of the respective grooves 3. Further, electrodes 8 are formed on the entire surfaces of the grooves 3 by the electroless plating. The top opening surfaces of the grooves 3 are closed by a roof plate 10 joined to the surface of the piezoelectric member 2 thereby to form a plurality of pressure chambers 14. In this case, the posts 19 comprise upper posts 19*a* formed of the piezoelectric member 2 and lower posts 19*b* formed of the piezoelectric member 18.

Figure 7:
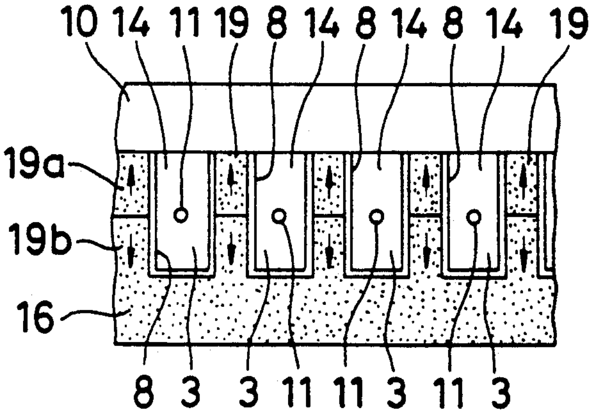
FIG. 7 is a vertical cross-sectional front view showing a modification.
Figure 8A:
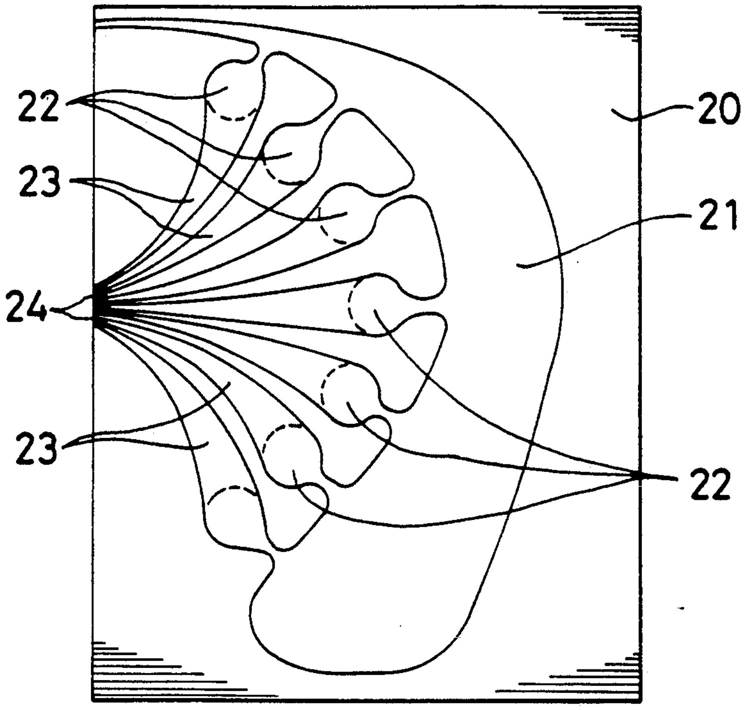
FIG. 8(a) (PRIOR ART)
FIG. 8 is a plan view showing a conventional example.
Figure 8B:
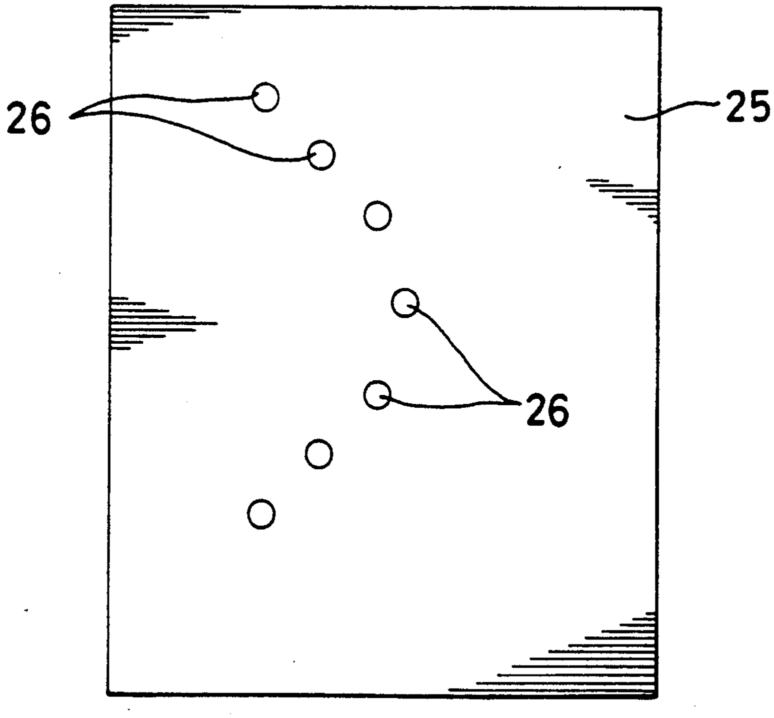
Figure 9:
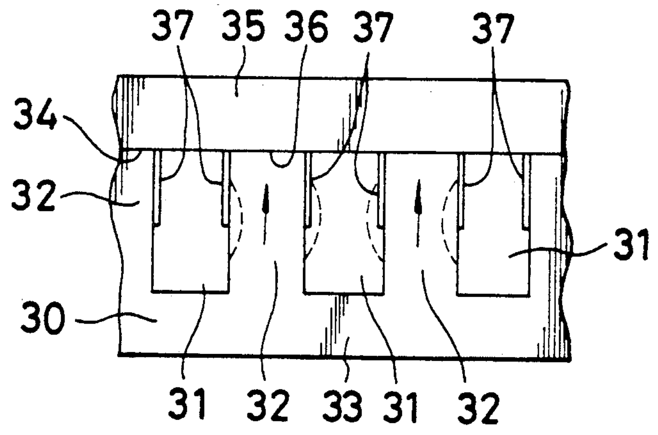
FIG. 9 (PRIOR ART)
FIG. 9 is a vertical cross-sectional front view illustrating other conventional example.
Figure 10:
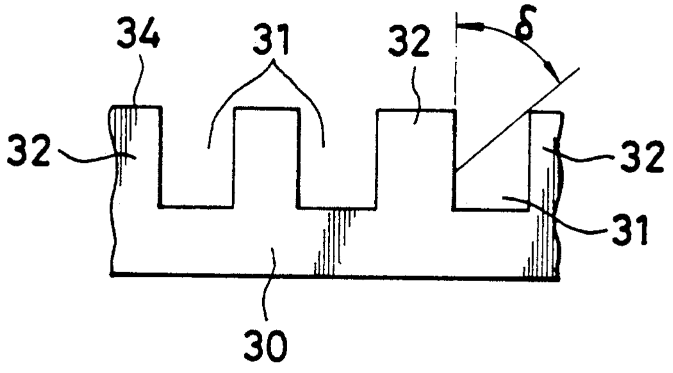
FIG. 10 (PRIOR ART)
FIG. 10 is a side view showing a method of forming electrodes.

When a desired voltage is applied to each electrode 8 under such a construction, the upper posts 19*a* are deformed with reference to a portion where they are joined to the roof 10, and the lower posts 19*b* are deformed in the same direction as the upper posts 19*a* on the basis of a portion where they are joined to the bottom plate 16. Therefore, the amount of strain or distortion of each post 19 increases as compared with the first embodiment. Even when the thickness of the piezoelectric member 18 of the lower posts 19*b* is made thick and the bottom plate 16 is omitted as shown in FIG. 7, the same effect as described above can be obtained and the number of parts can be reduced.

According to the present invention, as described above, the voltage is applied to the electrodes formed on the posts used to partition the respective pressure chambers to thereby develop the shearing strain in the posts so as to vary the pressure in the pressure chambers, thus flying the ink drops. However, no limitation is imposed on the selection of ink because a system for bubbling ink with heat and jetting the same is not used. Further, since the posts, which are formed of the piezoelectric member and cause the shearing strain, are arranged in the longitudinal direction of each pressure chamber, the pressure chambers and the ink jetting portions can be arranged at high density. Moreover, since the respective pressure chambers and the ink jetting portions are coupled directly to each other so as to avoid the pressure loss in structure, a plurality of pressure chambers can be arranged. The catalytic nucleus can be effectively applied to the concave-convex surfaces of the grooves defined in the piezoelectric member by effecting the pre-processing, i.e., causing the pre-processing solution to flow along the grooves at the relative velocity represented by $VW^2.(1+\cos\theta)/H^2>0.6$ mm/s before the electroless plating process. Then, the electrodes can be formed by producing the plating film on the basis of the catalytic nucleus, thereby making it possible to improve the production rate of the electrodes and reduce the manufacturing cost.

Further, the catalytic nucleus can be uniformly applied to the surface of each groove by bringing the pre-processing solution into contact with each groove at a high relative velocity, thereby making it possible to form pinholes-free and uniform electrodes on the internal surfaces of the grooves. Thus, the ink and the piezoelectric member can be separated from each other by the electrodes. Therefore, the piezoelectric member can be prevented from corrosion without forming a protection film.

Incidentally, the present invention is not necessarily limited to the aforementioned embodiment. Others will be described specifically by the following examples. The above embodiment shows the case where the electrodes 8 are formed on the entire side surfaces of the posts 4 in the grooves 3 and the bottom faces of the grooves 3. However, the electrodes 8 may be formed only on both sides of each upper post 4*a*. In this case, a lower layer 15 is formed of a resinous material in which the rate of tin of the Pd.Sn complex compound deposited when the catalyzing processing is effected during the electroless plating step, increases as compared with the case where the same processing is effected for the piezoelectric member 2. Further, the electrodes 8 can be formed only on the upper posts 4*a* by adjusting the time required to effect the accelerating processing in such a way that the complex compound deposited by the upper posts 4*b* of the piezoelectric member 2 is brought into a metallized Pd and the complex compound deposited by the lower posts 4*b* of the lower layer 15 remain as they are. In this case, the rigidity of the lower layer 15 is further reduced and the resistance to the strain of each upper post 4*a* becomes small, thereby enabling an increase in the entire strain efficiency of the posts 4. When the electrodes 8 are formed on the entire internal surfaces of the grooves 3, ink is not brought into contact with the lower layer 15 and hence the lower layer 15 is not corroded. Therefore, both the ink and materials used for the lower layer 15 can be selected widely.

The aforementioned embodiment also shows the case where the electroless plating material is used as nickel. This is not necessarily limited to the nickel. Particularly when ink under which the nickel is corroded, is used, it is desirable that gold is selected as the electroless plating. Further, the electrodes 8 are formed by the electroless plating using an inexpensive metal and an anticorrosive metal may be formed on the resultant product by plating.

Further, in the aforementioned embodiment, the catalyzing and accelerating processes are effected as a catalyst applying step for the pre-processing of the electroless plating. However, the catalyst applying step is not necessarily limited to these processes. Sensitizing and activating processes may be effected as the catalyst applying step. In this case, however, the electrodes 8 are formed on the entirety of each groove 3.

Moreover, in the aforementioned embodiment, the voltage applying method shown in FIG. 2 is used to make flying drops stable as a method of energizing a printer head. However, other voltage applying method which has conventionally been used, may be adopted.

Having now fully described the invention, it will be apparent to those skilled in the art that many changes and modifications can be made without departing from the spirit or scope of the invention as set forth herein.

What is claimed is:

1. A method of manufacturing a printer head, comprising the steps of:

preparing a substrate including at least one piezoelectric member polarized in its thickness direction;

cutting at equal intervals a plurality of mutually parallel grooves from the surface of said substrate to form a plurality of posts;

causing a pre-processing solution to flow along said grooves at the following relative velocity so as to effect pre-processing when the velocity of the pre-processing solution for electroless plating relative to said substrate is V (Mm/s), the height of each of electrodes to be formed on the internal surfaces of said grooves is H ($\mu$m), the width of said each groove is W ($\mu$m) and a contact angle at which said pre-processing solution is brought into contact with the internal surfaces of said grooves is $\theta$;

$$VW^2.(1+\cos\theta)/H^2>0.6 \text{ mm/s}$$

thereafter immersing said substrate in an electroless plating solution;

forming the electrodes on the surfaces of said grooves formed in said substrate;

fixing a roof plate on the surface of said substrate to form pressure chambers between the posts; and attaching an orifice plate provided with a plurality of ink jets to the end surface of said substrate so that the ink jets coincide respectively with the pressure chambers.

2. A method according to claim 1, wherein the electrodes are formed on the entire surfaces of said grooves formed in said substrate.

3. A method according to claim 1, wherein an electroless plating material of the electroless plating solution is nickel.

4. A method according to claim 1, wherein an electroless plating material of the electroless plating solution is gold.

5. A method according to claim 1, wherein said substrate further includes a bottom plate formed of aluminum or glass and a lower layer comprised of an adhesive, and the piezoelectric member and the bottom plate are joined together through the lower layer in the form of a three-layer structure.

6. A method according to claim 5, wherein said respective posts comprise upper posts corresponding to the piezoelectric member and lower posts corresponding to the lower layer having small rigidity compared with the piezoelectric member, and the electrodes are formed only on both side surfaces of said respective upper posts exposed to said grooves.

7. A method according to claim 1, wherein the pre-processing solution is allowed to flow along said grooves at a relative velocity of $VW^2.(1+\cos\theta)/H^2>0.6$ mm/s to thereby effect the pre-processing.

8. A method according to claim 7, wherein the electrodes are formed on the entire surfaces of said grooves formed in said substrate.

9. A method according to claim 7, wherein an electroless plating material of the electroless plating solution is nickel.

10. A method according to claim 7, wherein said electroless plating material of the electroless plating solution is gold.

11. A method according to claim 7, wherein said substrate further includes a bottom plate formed of aluminum or glass and a lower layer comprised of an adhesive, and the piezoelectric member and the bottom plate are joined together through the lower layer in the form of a three-layer structure.

12. A method according to claim 11, wherein said respective posts comprise upper posts corresponding to the piezoelectric member and lower posts corresponding to the lower layer having small rigidity compared with the piezoelectric member, and the electrodes are formed only on both side surfaces of said respective upper posts exposed to said grooves.

13. A method according to claim 1, wherein said substrate further includes a second piezoelectric member fixed on the first piezoelectric member polarized in the direction opposite to the first piezoelectric member.

* * * * *